United States Patent
Tsai et al.

(10) Patent No.: US 6,448,150 B1
(45) Date of Patent: Sep. 10, 2002

(54) METHOD FOR FORMING SHALLOW TRENCH ISOLATION IN THE INTEGRATED CIRCUIT

(75) Inventors: Hsin-Chuan Tsai; Pei-Ing Lee, both of Taipei (TW)

(73) Assignee: Nanya Technology Corporation, TaoYuan (TW)

( * ) Notice: Subject to any disclaimer, the term of this patent is extended or adjusted under 35 U.S.C. 154(b) by 393 days.

(21) Appl. No.: 09/055,254

(22) Filed: Apr. 6, 1998

(30) Foreign Application Priority Data

Jan. 20, 1998 (TW) ........................................ 87100742 A

(51) Int. Cl.[7] .............................................. H01L 21/76
(52) U.S. Cl. ..................................................... 438/427
(58) Field of Search ................................. 438/424, 427, 438/221, 296, 435

(56) References Cited

U.S. PATENT DOCUMENTS 5,445,989 A * 8/1995 Lur et al. ............. 148/DIG. 50
5,728,621 A * 3/1998 Zheng et al. ................ 438/427
5,786,263 A * 7/1998 Perera ......................... 438/431

OTHER PUBLICATIONS

S. Wolf Silicon Processing for the VLSI Era vol. I Lattice Press pp. 184, 1986.*
S. Wolf Silicon Processing for the VSLI Era vol. II Lattice Press pp. 227, 232, 238, 1990.*

* cited by examiner

Primary Examiner—Olik Chaudhuri
Assistant Examiner—David S Blum
(74) Attorney, Agent, or Firm—Bacon & Thomas

(57) ABSTRACT

A method for forming shallow trench isolation in an integrated circuit is introduced. Firstly, the first silicon oxide layer and a silicon nitride layer are formed subsequently on the silicon substrate. Then lithography and etching are used to open a shallow trench. Then thermal oxidation is performed. The following step is to form the shallow trench isolation by forming the second silicon oxide with high density plasma enhanced chemical vapor deposition. Then an organic spin-on-glass is coated and low temperature baking is performed. After that, partial etching back is performed to remove spin-on-glass outside the shallow trench. This etching recipe has high selectivity between the second silicon oxide layer to spin-on-glass. Then curing at temperature above 800° C. and etching back are performed with silicon nitride as end point.

17 Claims, 2 Drawing Sheets

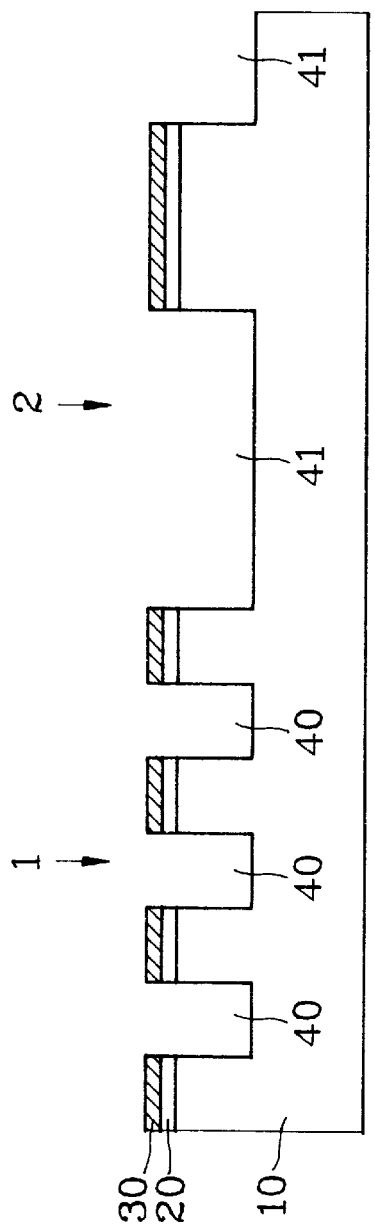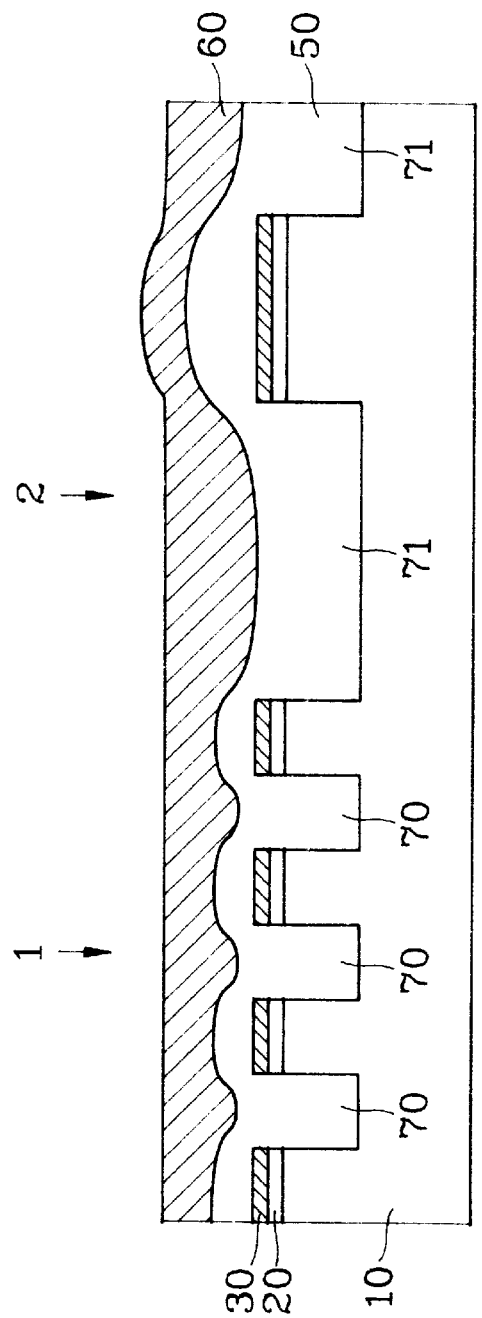
FIG. 1
FIG. 2

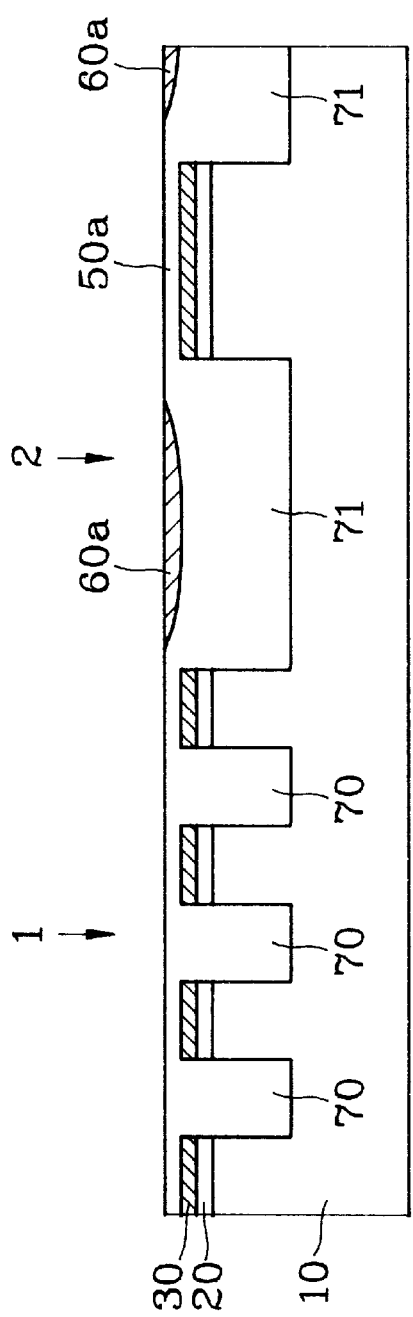
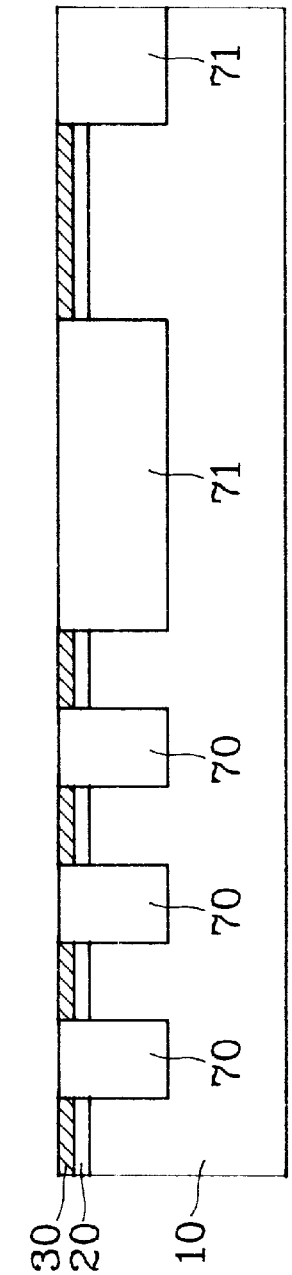

METHOD FOR FORMING SHALLOW TRENCH ISOLATION IN THE INTEGRATED CIRCUIT

BACKGROUND OF THE INVENTION

1. Field of the Invention

This invention relates to a method for forming trench isolation in the integrated circuit.

2. Description of the Prior Art

In these years, the space between transistors has been getting smaller and smaller along with the increase of the density of memory cells in the integrated circuit. To secure the operation of each transistor from the disturbance of any other, something has to be done to isolate every transistor that the phenomenon of latch up could be avoided. This kind of technique is called "isolation process".

Local oxidation(LOCOS) has been widely used in the early years. It forms a field oxide layer of several thousands anstrons between transistors by thermal oxidation. Because silicon dioxide is not an electric conductor, it could act as isolation between transistors. But some unavoidable shortage happens when using local isolation. The phenomenon of "bird's beak" will take place during the formation of field oxide by wet oxidation, which can affect the subsequent progress in the active device region. Furthermore, the effect of "bird's beak" goes more and more serious when the manufacturing technique enters into the sub-micrometer or even the deep sub-micrometer realm. In addition, before the formation of field oxide, ions have to be implanted and then drived into the silicon substrate to form a channel stop. As the manufacturing technique gets into the sub-micrometer or deep sub-micrometer realm, narrow-width effect happens as a result of subsequent high temperature treatments. Therefore, a lot of isolation processes have been developed to meet the requirement in the realm of sub-micrometer and even deep sub-micrometer.

One of the most popular method is shallow trench isolation. It is done by firstly opening a shallow trench in the silicon substrate through etching, filling dielectric into the shallow trench and then performing etching back. Then the active devices will be built in the space between separate isolation regions. In the practical design of the integrated circuit, some regions need only isolation with smaller area, some others need the isolation with larger area. The latter ones suffer from "dishing effect" during the progress of filling dielectric and etching it back. It is because that it takes a long time to etch back the very thick dielectric layer outside the shallow trench, thus over-etching is easily happened. In addition, the kink effect happens when subsequently forming the gate oxide by thermal oxidation. The so called "kink effect" denotes abnormal turning-on of transistors. The reason of its happening is that the thickness of the shallow trench shrinks at the edge, resulting in larger electrical field around there. This kind of isolation technique is also unable to meet the electric requirement of transistors To solve the problem of dishing effect, many processes have been developed. For example, divide the shallow trench with large area into several small ones. But all of those methods include complicated steps and cost a lot. So they are all improper to take place of local isolation.

SUMMARY OF THE INVENTION

It is therefore an object of this invention to offer a method of forming shallow trench isolation.

Another object of this invention is to provide a shallow trench isolation technique used in the isolation process of the integrated circuit.

The above goals have been reached through the following steps. Firstly, a layer of the first oxide layer and the first silicon nitride layer are subsequently formed, and the region of shallow trench is defined by lithography. Then taking the first oxide layer and the first silicon nitride layer as hard mask, perform etching on silicon substrate to form the shallow trenches with smaller area and the shallow trench with larger area, following with the step of thermal oxidation. Then the second silicon dioxide layer is deposited to form the shallow trench which has smaller area and the shallow trench which has larger area. The second silicon oxide is formed by plasma-enhanced chemical vapor deposition. After that, an organic spin-on-glass is coated and low temperature baking is performed.

A recipe whose etching rate to the second silicon oxide is higher then to spin-on-glass is used to perform partial etching back to remove spin-on-glass outside the shallow trench. Then the curing step at temperature higher then 800° C. and etching back by chemical mechanical polishing are performed. Silicon nitride is set as the endpoint of etching. After removing the silicon nitride layer, take away the first silicon oxide layer. Then the method for forming shallow trench isolation provided by the present invention is thus accomplished.

BRIEF DESCRIPTION OF THE DRAWINGS

The invention, as well as its many advantages, may be further understood by the following detailed description and drawings in which:

FIG. 1 is a cross-section view of the shallow trench region in the present invention.

FIG. 2 is a cross-section view of the substrate region depicted in FIG. 1, following the forming of a second layer of silicon dioxide and spin-on glass.

FIG. 3 is a cross-section view of the substrate region depicted in FIG. 2, following the etching away of spin-on-glass which is over silicon nitride.

FIG. 4 is a cross-section view of the substrate region depicted in FIG. 3, following the removement of the silicon dioxide residue and spin-on-glass over silicon nitride.

DETAILED DESCRIPTION OF THE PREFERRED EMBODIMENT

In the following description, one best embodiment is presented. However, variations are possible.

As illustrated in FIG. 1, the first silicon oxide layer 20 ($SiO_2$) and the first silicon nitride layer 30 ($Si_3N_4$) are formed subsequently over silicon substrate 10, then forming the region of shallow trench by lithography and ion etching. After that, taking the first oxide layer 20 and the first nitride layer 30 as hard mask to etch the substrate 10 to form the shallow trench 40 with smaller area in region 1 and the shallow trench 41 with larger area in region 2. Then thermal oxidation is performed that the atoms inside the shallow trench may be rearranged to compensate the defects derived from being hit by high energy ions. This thermal oxidation will form an extremely thin oxide layer inside the shallow trench (not shown in the figures).

The nitride layer 30 functions as hard mask to protect the active region when etching shallow trench. The first oxide layer 20 mentioned above can be formed by thermal oxidation or chemical vapor deposition. Its major function is to serve as the pad of the nitride layer 30 to release the over-high stress between the nitride layer 30 and the silicon substrate 10.

Please referring to FIG. 2, the second oxide layer 50 is then deposited to fill up the shallow trench to form the shallow trench isolation with smaller area 70 in region 1 and the shallow trench isolation with larger area 71 in region 2. The thickness of this second dielectric layer is between 2000 Å to 8000 Å. Then an organic spin-on-glass layer is coated overall and low temperature baking is performed.

The second oxide layer is now formed by high density plasma chemical vapor deposition (HDPCVD). The film formed in this way has an excellent gap-filling ability and another characteristic—thicker is the film formed in larger area and thinner is the film formed in smaller region, as denoted in FIG. 2. Because the shallow trench produced in smaller area is more narrow, the space between adjacent trenches is smaller, so the second silicon oxide layer formed over silicon nitride is thinner. On the contrary, the shallow trench produced in the larger area is wider, the space between adjacent trenches is greater, so the silicon oxide layer formed over silicon nitride is thicker. In addition, the second silicon oxide can be formed by several cycles of plasma enhanced chemical vapor deposition operating with etching back. This method can each the same effect mentioned above.

The thickness of spin-on-glass (SOG) is ranging from 2000 Å to 7000 Å. It can be performed once for all or in several times. The thickness of SOG above the higher feature is maintained to be less one half of which above the lower feature. The temperature of low temperature baking is between 150° C. to 350° C. This step is used to consolidate spin-on-glass rather than evaporate all of its organic solvent. With organic compound remained, its chemical property is different from which of the oxide layer formed by high density plasma chemical vapor deposition. Therefore, it is very easy: to find out a recipe with high selectivity of the second oxide layer to spin-on-glass during subsequent etching back.

A In addition, since the organic spin-on-glass layer is really thick, if curing step is performed at this time, the volume of spin-on-glass, will shrink because its intrinsic structure. This will help increase the stress between spin-on-glass with the second dielectric layer and result in peeling of spin-on-glass. Therefore, only low temperature baking is .chosen to be performed in the present invention to avoid peeling of spin-on glass.

Then referring to FIG. 3, partial etching is performed to etch away spin-on-glass 60 outside the shallow trench. One recipe is used that the etching rate of the second silicon oxide layer is higher then that of spin-on-glass. Although before partial etching back, the silicon oxide 50 over the shallow trench which has larger area is thicker, but the etching rate of silicon oxide is designed to be higher than which of spin-on-glass. Therefore, only a thin layer of silicon oxide 50a remains over silicon nitride after etching back.

Then the curing step is performed over the spin-on-glass layer at the temperature above 800° C. to completely evaporate the organic solvent in it. In this way, the binding between silicon and oxygen will be strengthened and the structure of spin-on-glass can be more dense, so it is not easy to etch the spin-on-glass layer. At this time, it is over the shallow trench isolation 71 in region 2 remains most of the residue of spin-on-glass 60a. This residue of spin-on-glass can function as the hard mask in the following process of etching back. to prevent the dishing effect Referring to FIG. 4, etching back is performed by chemical mechanical polishing (CMP) to remove the second oxide residue 50a which is over silicon nitride 30. This silicon nitride layer is set as the end point of etching. Because the second oxide residue over silicon nitride is very thin, it takes only a short time to etch it back. So the dishing effect resulted from overdoing of etching back can be avoided. Furthermore, with the spin-on-glass layer 60a which has impact structure as the hard mask, etching of the shallow trench 71 which has larger area in region 2 is slower, so the dishing effect can be further prevented. In addition, even some part of spin-on-glass residue 60a remains in the shallow trench after etching back, its influence to the electrical property of device is negligible. It is because the spin-on-glass residue has already been siliconized after curing step at high temperature. At last, after the first silicon nitride layer and the first oxide layer is removed, a shallow trench isolation with excellent electric property is therefore obtained.

The method of forming shallow trench isolation provided in the present invention has the following benefits:

1. The dishing effect which affects the subsequent manufacturing processes badly in the active device region can be avoided.

2. The transistors in the active region can be free from the kink effect.

3. Additional masks are not necessary to be added that the processes can be mad much simpler.

It may thus be seen that the objects of the present invention set forth herein, as well as those made apparent from the foregoing description, are efficiently attained. While the preferred embodiment of the invention has been set forth for purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A method for forming shallow trench isolation in a silicon substrate comprising the steps of:
   a. forming a hard mask over said silicon substrate;
   b. defining said hard mask and forming a shallow trench by etching;
   c. forming an oxide layer to fill said shallow trench and over said hard mask, in which the oxide layer over said hard mask which has smaller area is thinner and the oxide layer over said hard mask which has larger area is thicker;
   d. coating a layer of spin-on-glass with suitable thickness control and performing low-temperature baking;
   e. partially etching back said spin-on-glass and oxide layer to remove the part outside the shallow trench, wherein said partial etching-back is performed with the recipe whose etching rate to said oxide is higher than that of spin-on-glass;
   f. curing said spin-on-glass of which a residue partially remaining over the shallow trench in the larger area serves as a protection mask; and
   g. etching back the remaining of said oxide and said spin-on-glass over the hard mask to remove it and taking said hard mask as the end point of etching.

2. The method according to claim 1, the step of removing said hard mask is further comprised after etching back.

3. The method according to claim 1, wherein said hard mask comprises an oxide layer and a silicon nitride layer over it.

4. The method according to claim 3, wherein said silicon oxide layer is formed by thermal oxidation.

5. The method according to claim 3, wherein said silicon nitride layer is formed by chemical vapor deposition.

6. The method according to claim 1, after forming said shallow trench, a step of thermal oxidation is further included.

7. The method according to claim 1, wherein said oxide layer is formed by high density plasma enhanced chemical vapor deposition.

8. The method according to claim 1, wherein said oxide layer is formed through several cycles of plasma-enhanced chemical vapor deposition operating with etching back.

9. The method according to claim 1, wherein the thickness of said oxide layer is ranging from 2000 Å to 8000 Å.

10. The method according to claim 1, wherein spin-on-glass is organic spin-on-glass.

11. The method according to claim 1, wherein the thickness of spin-on-glass is ranging from 2000 Å to 7000 Å.

12. The method according to claim 1, wherein the thickness of SOG above the higher feature is maintained to be less one half of which above the lower feature.

13. The method according to claim 1, wherein the temperature of low-temperature is ranging from 150° C. to 350° C.

14. The method according to claim 1, wherein the partial etching-back is performed with the recipe whose etching rate to said second silicon oxide is higher then which to spin-on-glass.

15. The method according to claim 1, wherein the curing step is performed by annealing at a temperature above 800° C.

16. The method according to claim 1, wherein etching back in step g is performed by chemical mechanical polishing.

17. The method according to claim 1, wherein etching back in step g is performed by ion etching.

* * * * *